United States Patent [19]

Risbud et al.

[11] Patent Number: 4,464,557

[45] Date of Patent: Aug. 7, 1984

[54] CRYSTAL GROWTH IN GLASSES AND AMORPHOUS SEMICONDUCTORS

[76] Inventors: Subhash H. Risbud, 301 E. Willard, Urbana, Ill. 61801; Jainagesh A. Sekhar, 1502 N. Mattis, Champaign, Ill. 61820

[21] Appl. No.: 323,824

[22] Filed: Nov. 23, 1981

[51] Int. Cl.$^3$ ............................................. B23K 27/00
[52] U.S. Cl. ..................... 219/121 LM; 219/121 LE; 219/121 LF
[58] Field of Search ..... 219/121 LM, 121 L, 121 LE, 219/121 LF; 65/33

[56] References Cited

U.S. PATENT DOCUMENTS 3,756,799  9/1973  Neuroth ............................. 65/33 X
4,201,559  5/1980  Rittler ................................ 65/33 X Primary Examiner—C. L. Albritton
Attorney, Agent, or Firm—Mathew L. Kalinowski

[57] ABSTRACT

Crystal growth is effected by laser energy input and direct heating at a glass-crystal interface. The process is based on the use of a laser beam of appropriate wavelength as a means of providing heat to the interface due to transmittance differences between the glass and crystal phases. The process is useful for inducing crystal growth in amorphous semiconductors and oriented crystal growth in ceramic, metallic, and polymeric glasses, and for producing shaped single crystals from preformed glassy shapes. The transmittance differences can be used to provide direct heat and thus drive any two-phase boundary on a microscopic scale.

11 Claims, 1 Drawing Figure

CRYSTAL GROWTH IN GLASSES AND AMORPHOUS SEMICONDUCTORS

This invention relates to a method for converting an amorphous material or glass into single crystal or polycrystalline form. More particularly, this invention relates to a method of inducing crystal growth by means of laser energy input at a glass-crystal interface under conditions providing direct control of interface mobility.

Crystal growth and directional solidification of amorphous, molten substances are well known in the art. For example, Gürs, U.S. Pat. No. 3,897,590 discloses the production of monocrystals of coordinatively bound metal acids by the floating zone method wherein the floating melt zone is produced by irradiation with a laser beam.

Haggerty et al., U.S. Pat. No. 3,944,640 disclose a method for forming fibers of a refractory material be concentrating laser energy within a melt zone on a moving feed rod of the material.

Burrus, Jr. et al., U.S. Pat. No. 4,040,890 disclose a technique for growing doped single-crystal fibers by melting the end of a rod of the doped material with a laser beam and pulling the fiber from the melt.

Hggerty, U.S. Pat. No. 4,197,157 discloses a method of forming refractory tubing in polycrystalline or single-crystal form by moving a preformed tube of the material through a heating zone of laser energy providing sufficient heat to form a molten ring in the advancing tubing.

Disabilities encountered during such prior art directional crystallization of glasses include:
(a) uncontrolled nucleation ahead of the growing interface due to the spatial and relative effects of the temperature and temperature gradients;
(b) lack of adequate control of interface velocity in a regime where a planar interface may break down to a cellular morphology; and
(c) practical crystal growth rates tend to be small under temperature gradient conditions which avoid uncontrolled nucleation.

The growth of a transforming interface is controlled by heat diffusion and/or interface attachment kinetics. The interface is essentially at local equilibrium in the former case, while in the latter case large undercoolings result in severe loss of local interface equilibrium. For glass-forming systems, interface attachment kinetics are sluggish at large undercoolings due to limited diffusional mobility. The position of the interface can be analytically determined by simultaneously solving the differential equations that govern the heat flow and an interface kinetic equation relating to the velocity of the interface to its undercooling. In glass-forming systems, this kinetic equation is known to show a maximum at some temperature below the equilibrium temperature.

As the interface starts to move, the liberated heat of transformation heats the interface and is partially transported down the gradients that have now been created between the interface and its surroundings (i.e., the glass as well as the transformed solid region). The heated interface adjusts its velocity to satisfy the undercooling it experiences. Depending on the position of the interface with respect to the allowable maximumu crystal growth rate, the interface velocity will be faster or slower than in its previous position. The temperature gradients that the interface experiences will result in simultaneous adjustment of the interface temperature. The amount of this interface heating and related interface velocity (before approaching a steady state) are normally strongly dependent on the material parameters involved.

For the above-cited reasons, many chemical compositions of practical interest are either difficult or impossible to grow to single crystals or to oriented polycrystalline form.

Accordingly, it is an object of this invention to provide a method for the growth of crystals from glasses that overcomes prior-art disabilities.

It is another object of this invention to provide a method for the growth of crystals from glasses that utilizes laser energy for close control of heating and melting at the glass-crystal interface.

It is still another object of this invention to provide a method for the growth of crystals from glasses that utilizes laser energy to control interface velocity at the glass-crystal interface.

These and other objects will become apparent as description of the invention proceeds.

In accordance with this invention, crystal growth in a glassy material having a glass phase-crystal phase interface is induced by the method comprising the step of heating the interface by irradiation with laser energy of wavelength such that it is substantially transparent to one phase and substantially absorbed by the other phase; and the step of continuously cooling both phases during irradiation. Suitably, a rod of the bulk glass of the material to be crystallized is prepared by rapid solidification of a liquid melt or by compaction of an amorphous powder. A small portion of the rod is crystallized by heating in a sufficiently steep temperature gradient to create a glass-crystal interface. The interface is then heated with a laser beam of wavelength selected so that laser energy is absorbed preferentially by one of the phases. Both phases are cooled during laser irradiation so that heat is available only at the interface.

The term "glass" is used in the context of this invention in a sense to include the amorphous solids derived from ceramic oxides; amorphous metals and metallic alloys; and amorphous, crystallizable organic polymers. Glassy materials that can be employed in the practice of this invention include the conventional ceramic oxide glasses such as the silicates, borates, and phosphates; electro-optical materials such as lithium niobate, barium strontium niobate, lead molybdate, yttrium aluminum garnet, and the like; metals and metal alloys such as iron-silicon-palladium alloys used in metallic glass technology; amorphous semiconducting glasses, for example chalcopyrite compositions such as $CdGeAs_2$, $CdGeP_2$, and other group $II$-$IV$-$V_2$ compounds, and chalcogenide compositions such as $AsTe_3$, $AsSe_3$, and the like. Crystallizable organic polymers can also be employed in the practice of this invention, for example Polyacrylates, polymethacrylates, polyolefins such as polyethylene, polypropylene, and the like.

Lasers having specified wavelengths and either continuous wave or pulsed output are readily selected from and are readily available in the art. For example, solid state lasers are known that operate at 0.6–3 $\mu$m; gas lasers at 0.2–100 $\mu$m; dye lasers at 0.3–1.2 $\mu$m; semiconducting lasers at 0.3–31 $\mu$m; and chemical lasers at 2–100 $\mu$m. In addition to specified wavelength, it is understood that the laser beam must have sufficient energy to effect crystal growth at the interface. Particularly effective are the ruby laser, the $CO_2$ laser, and the Nd:YAG laser (neodynium-doped yttrium aluminum garnet).

BRIEF DESCRIPTION OF THE DRAWING

The FIGURE illustrates an apparatus in which the method of the invention can be practiced.

DESCRIPTION OF AN ILLUSTRATIVE EMBODIMENT

Figure 1:
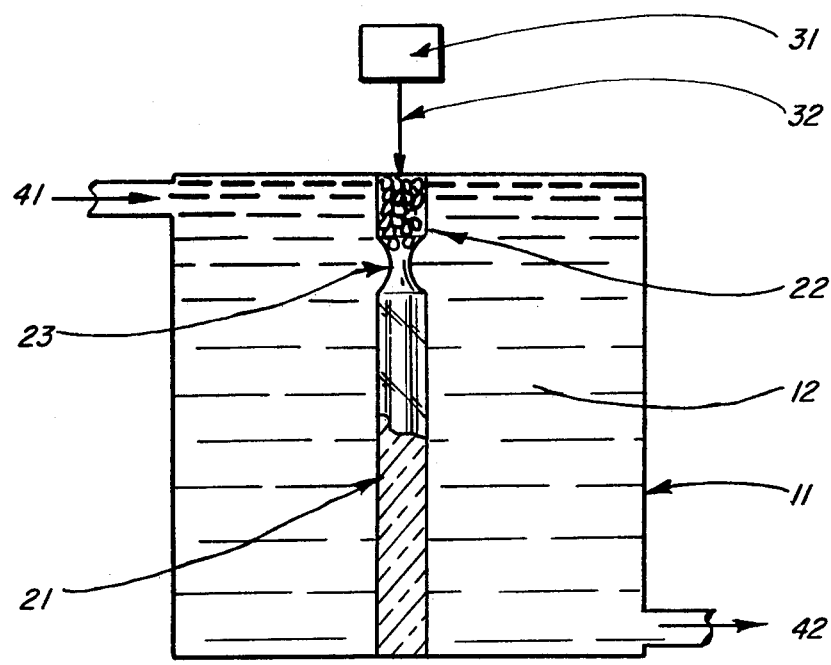

The invention is further illustrated by reference to the following procedures and examples.

A rod of $CdGeAs_2$ glass, about 1.5 mm in diameter and about 50 mm in length, is prepared by rapid cooling of a liquid melt of the alloy. The tip of the rod is crystallized under a relatively steep temperature gradient of 500° to 600° C./cm thereby creating a glass-crystal interface. As illustrated in FIG. 1. the rod is placed in container 11. The glass portion of the rod is shown at 21, the crystallized potion at 22, and the glass-crystal interface at 23. Laser source 31 is a Nd:YAG laser providing a laser beam 32 of 1.06 μm wavelength which passes through the crystal phase and is preferentially absorbed by the glass phase at the interface. The temperature at the interface during crystallization reaches from about 475° to about 500° C. Both phases are cooled by circulating coolant 12, suitably water or a high fluidity oil, through container 11 via ports 41 and 42.

The transmitted laser energy, $\phi$, reaching the glass-crystal interface can be expressed as:

$$\phi = (I_e/I_i) = (1-R_1)(1-R_2) \exp(-\beta_T d)$$

where
$I_e$ and $I_i$ = emergent and incident intensity
$R_1$ and $R_2$ = fraction of energy reflected at each interface
$\beta_T$ = absorption distance
d = transmission distance Under the conditions described above, crystals are advanced into the glass rod by heat transport to the interface by the laser beam, while both the glass and crystal areas are continuously cooled. The interface heating during continuous cooling is due to the differences in the transmittance values of the glass and the crystals. At any fixed laser wavelength the energy absorbed by the glass and the crystalline areas is different. With the laser beam heating the glassy end of the rod radiative heat transport occurs to the glass-crystal interface. Since both the glass and crystal areas are being cooled, the laser heat is available only at the interface to permit the continuous stable propagation of the crystallization front. This leads to the formation of oriented crystals and single crystal morphologies in the glass or amorphous semiconductor chosen.

The method of this invention avoids the breakdown of a stable glass-crystal interface by introducing heat directly at the interface. Nucleation ahead of the interface or other forms of breakdown are avoided while improving the kinetics for growth of an interface which will grow because of favorable thermodynamics. The choice of a laser of specific wavelength is especially significant to the process since the laser must operate in a region where one phase is greatly transparent to that wavelength while the other phase has greater absorptance. The thermal properties of the glass being crystallized, including the heat of crystallization along with the kinetic equations governing the growth of the interface, will determine the power and power density of the incident laser beam and whether a pulsed or continuous laser is required.

Although this invention has been described with particular reference to certain preferred embodiments thereof, it is understood that variatons and modifications can be effected within the spirit and scope of the appended claims. It is intended that all matter contained in the above description and FIGURE shall be interpreted in an illustrative and not in a limiting sense.

What is claimed is:

1. A method of inducing crystal growth in a glassy material having a glass phase-crystal phase interface comprising the step of heating the interface by irradiation with a laser beam, said beam having a wavelength such that it is substantially transparent to one phase and substantially absorbed by the other phase and said beam having energy sufficient to effect said crystal growth at the interface; and the step of continuously cooling both phases to maintain them in the solid state during the crystal growth process.

2. The method of claim 1 wherein the glassy material is an amorphous ceramic oxide selected from the group consisting of ceramic silicates, borates, and phosphates.

3. The method of claim 1 wherein the glassy material is an amorphous electro-optical material selected from the group consisting of lithium niobate, barium strontium niobate, lead molybdate, and yttrium aluminum garnet.

4. The method of claim 1 wherein the glassy material is an amorphous semiconducting chalcopyrite group II-IV-$V_2$ composition.

5. The method of claim 4 wherein the semiconducting composition is selected from the group consisting of $CdGeAs_2$ and $CdGeP_2$.

6. The method of claim 1 wherein the glassy material is an amorphous semiconducting chalcogenide composition selected from the group consisting of $AsTe_3$ and $AsSe_3$.

7. The method of claim 1 wherein the glassy material is a crystallizable organic polymer selected from the group consisting of polyacrylates, polymethacrylates, and polyolefins.

8. The method of claim 7 wherein the polyolefin is selected from the group consisting of polyethylene and polypropylene.

9. The method of claim 1 wherein the laser is selected from the group consisting of ruby, $CO_2$, and Nd:YAG lasers.

10. The method of claim 1 wherein the glassy material is preformed in the shape of a rod one end of which consists of a crystal phase which is substantially transparent to the laser beam, the major portion of the rod consisting of a glassy phase which substantially absorbs the laser beam.

11. The method of claim 10 wherein the rod consists essentially of $CdGeAs_2$ and the laser is Nd:YAG having an output wavelength of 1.06 μm.

* * * * *